United States Patent [19]
Tanaka

[11] 3,984,790
[45] Oct. 5, 1976

[54] ELECTROMECHANICAL REED FILTER

[75] Inventor: Toshiharu Tanaka, Kadoma, Japan

[73] Assignee: Matsushita Electric Industrial Co., Ltd., Japan

[22] Filed: July 11, 1974

[21] Appl. No.: 487,680

[30] Foreign Application Priority Data
July 20, 1973 Japan .......................... 48-85107[U]
Oct. 15, 1973 Japan ........................ 48-119990[U]

[52] U.S. Cl. .................................. 333/71; 310/8.2; 333/72
[51] Int. Cl.² ..................... H03H 9/04; H03H 9/26; H01L 41/02; H01L 41/10
[58] Field of Search ........... 333/72, 71, 30 R, 30 M; 310/25, 26, 8, 8.1, 8.2, 8.3, 8.5, 8.6, 9.1, 9.7; 58/23 TF; 84/409; 331/154–157

[56] References Cited
UNITED STATES PATENTS

| | | |
|---|---|---|
| 1,645,090 | 10/1927 | Burgeson ........................ 339/93 C |
| 2,866,058 | 12/1958 | Hebenstreit ................. 339/101 UX |
| 2,989,578 | 6/1961 | Wagner et al .................... 339/93 R |
| 3,354,413 | 11/1967 | Ko ....................................... 333/72 |
| 3,505,657 | 4/1970 | Whitehouse ................ 333/30 R X |
| 3,683,213 | 8/1972 | Staudte ............................. 310/9.6 |
| 3,743,973 | 7/1973 | Jones ............................. 333/30 R |
| 3,805,348 | 4/1974 | Nagata et al .................... 310/8.2 X |

*Primary Examiner*—Alfred E. Smith
*Assistant Examiner*—Marvin Nussbaum
*Attorney, Agent, or Firm*—Robert E. Burns; Emmanuel J. Lobato; Bruce L. Adams

[57] ABSTRACT

An electromechanical reed filter has a pair of mechanically resonant reed elements each having an electromechanical transducer. The transducer coupled to a terminal by means a connecting lead is applied with a shock-absorbing member such as resilient adhesive in a position anywhere between the contact point thereof with the transducer and the terminal so that variations in the natural frequency and Q value of the reed elements caused by deformation of the connecting leads due to abnormal shock or other ambient conditions are effectively eliminated.

11 Claims, 9 Drawing Figures

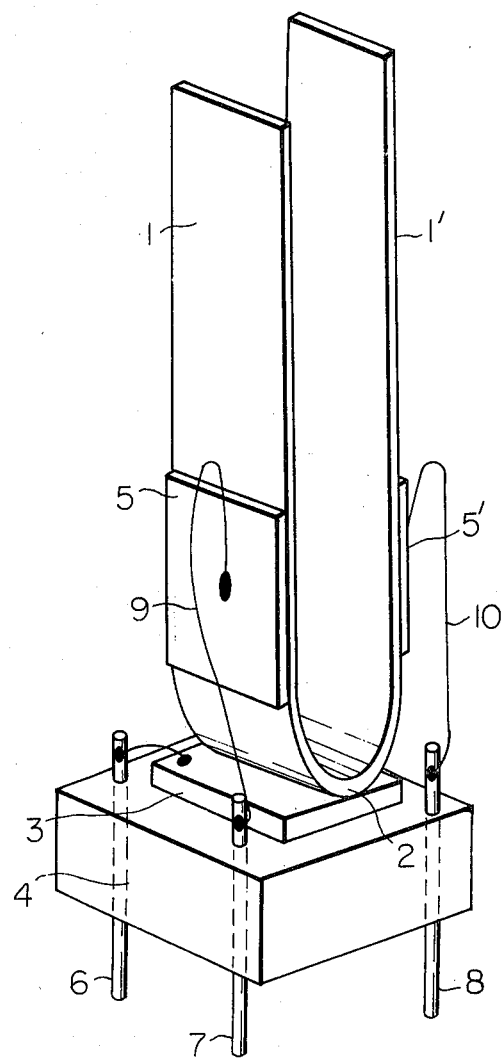

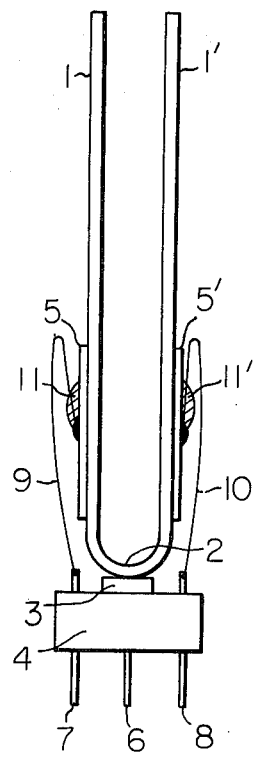
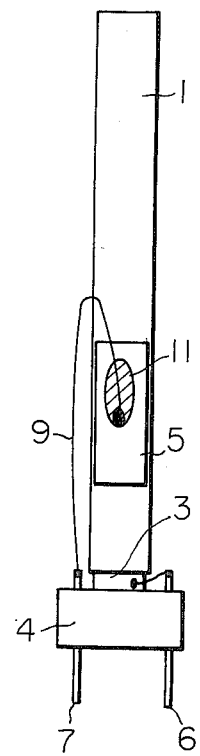

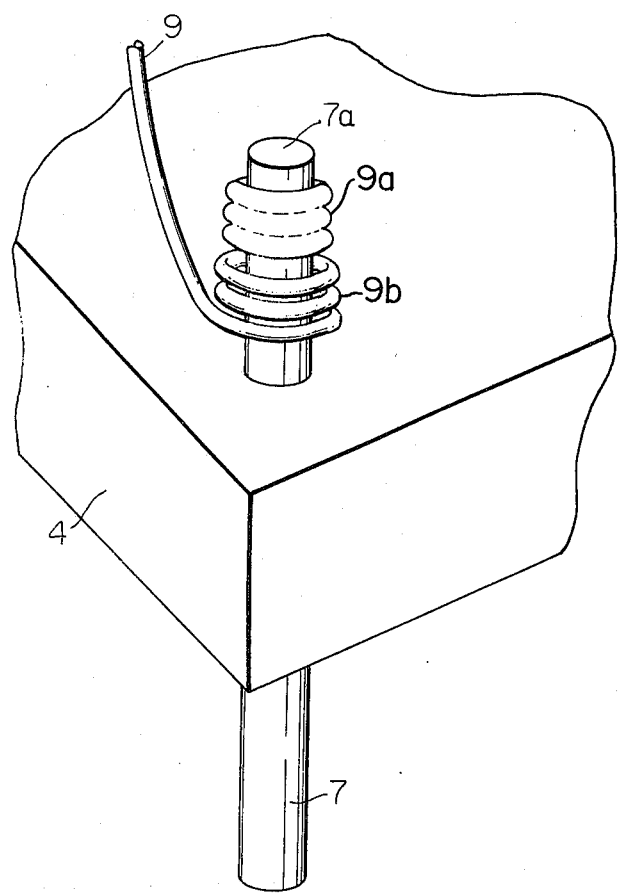

ELECTROMECHANICAL REED FILTER

The present invention relates to frequency sensitive electromechanical systems, and particularly to a miniature type electromechanical reed filter employing a vibratory reed as the frequency filtering element, and more particularly to means for ensuring stability against abnormal external shock and elevated ambient temperatures.

It is well known that a tuning fork which consists of a pair of metal, vibratory reeds extending from the end of a stem, when struck, emits a tone of fixed pitch. Because of their simple mechanical structure, purity of tone, and constant frequency, tuning forks are widely used as standards of frequency in music acoustics. Because of their constant frequency which is primarily determined by the length and the thickness of the reed elements, tuning forks are also used as a filtering element in an arrangement known as an electromechanical reed filter. In such arrangement, the tuning fork is provided with a pair of electromechanical transducers such as piezoelectric elements, one for causing vibrations by an exciting input signal and the other for converting the vibration at the natural frequency of the tuning fork into an electric signal. The tuning fork, when excited by the input signal, is caused to vibrate at its natural or fundamental frequency, and thus only that signal having a frequency which is equal to the fundamental frequency is obtained at the output. Electrical connections are made to the transducers to couple the same to associated input and output circuitry.

In order to assure good input-to-output signal ratio, it is necessary that the piezoelectric elements be located in a suitable position away from the stem of the tuning fork. However, this entails difficulty in allowing the reed elements to vibrate at their natural frequency free from the influence of electrical connections. If the length of the electrical connections or lead wires is short or large gauge wires are employed, the free vibrations of the reed elements would be adversely affected, while if the length is long there could occur a possibility of the wires coming into contact with the reeds when abnormal shock is applied, thus affecting the natural frequency of the tuning fork. Wires of too small diameter are subject to breakage when abnormal shock is applied to the reed filter. Further, the wire connected at the opposite ends thereof to respective terminals would also tend to vibrate at its natural resonant frequency determined by the length of the wire even when the reed elements are excited by input signal, and thus introduce a spurious vibration.

Therefore, an object of the present invention is to minimize the effect of spurious vibrations due to the length of lead wires coupling the electromechanical transducers to the respective terminals.

Another object of the invention is to provide an electromechanical reed filter in which the reed elements are allowed to vibrate at their natural frequency without being adversely affected by the deformation of the electrical connections.

In accordance with the present invention, there is provided an electromechanical reed filter which comprises a base member, a pair of elongated, mechanically resonant reed elements, one end regions of the reed elements being secured to each other and to the base member, electromechanical transducers each being secured to the side surface of the reed element, terminals on the base member, connecting leads coupled at the opposite ends thereof to a respective terminals and the electromechanical transducers, and shock-absorbing means on the connecting leads in a position anywhere between the contact points of the connecting lead with the transducer and the terminal.

The invention will be understood from the following description taken in conjunction with the accompanying drawings, in which:

FIG. 1 is a perspective view in elevation of a conventional electromechanical reed filter;

FIG. 4 is an elevational view of the reed filter of FIG. 1 with resilient adhesive being applied to the contact points of the connecting leads with the transducers;

FIG. 5 is a side view of the FIG. 4 arrangement;

FIG. 8 is a fragmentary perspective view of the reed filter showing another embodiment of the invention.

Figure 2A:
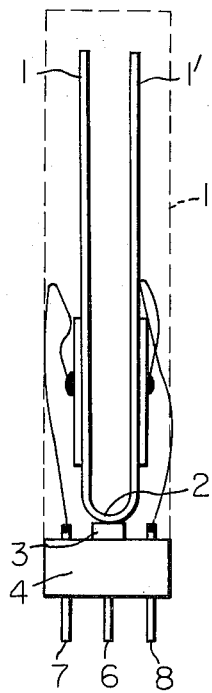
FIGS. 2a and 2b illustrate deformations of connecting leads employed for coupling the terminals and the transducers of the reed filter of FIG. 1.
Figure 2B:
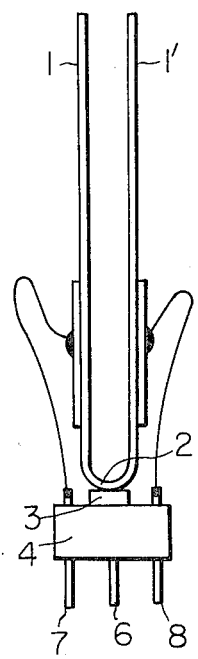

Referring now to FIG. 1, there is shown a conventional electromechanical reed filter which comprises a pair of elongated, mechanically resonating metal reed elements 1 and 1' integrally formed with a stem 2 secured to a metal support member 3 which in turn is secured to a base member 4. Electromechanical transducers 5 and 5' such as piezoelectric elements are secured to the sides of the reed elements 1 and 1' in positions intermediate of the stem 2 and the free ends of the reeds, preferably in positions adjacent the stem 2 as illustrated in FIG. 1. Terminals 6, 7 and 8 are provided which extend through the base member 4 of an insulating material and are fixed thereto. Lead wires 9 and 10 couple the electrodes of the piezoelectric elements 5 and 5' to terminals 7 and 8, respectively. The terminal 6 is connected to the metal support 3 to serve as a connection to ground. Small gauge, easily deformable wires are employed as the electrical connections in order that the reed elements are free from disturbances caused by the connecting lead wires. The use of smaller gauge wires would increase the possibility of the wires breaking apart upon receipt of an abnormal shock, while the use of large gauge wires would cause variations in the fundamental frequency and the Q value of the reed elements. If abnormal shock is applied to the reed filter, the reed elements 1 and 1' are caused to vibrate violently which in turn causes deformation or flexure of the lead wires as shown in FIGS. 2a and 2b. When the wire is brought into contact with the reed element 1' as shown in FIG. 2a, it causes the reed element 1' to vary its fundamental frequency and its Q value. Further, if the casing 11 is provided in which the filter is housed, there is a possibility of the wires coming into contact with the inner walls of the casing 11 due to the abnormal shock, and even such a contact with the casing would tend to vary the frequency and the Q value of the reed elements. If the wires are deformed in such a way as to bulge out sideways as shown in FIG. 2b, the deformed wires act in a way as to pull the reed elements 1 and 1' away from the longitudinal axis thereof, so that a variation in the fundamental frequency and the Q value of the reed elements occurs. It is also likely that such deformation would occur as a result of an elevated ambient temperature.

Figure 3:
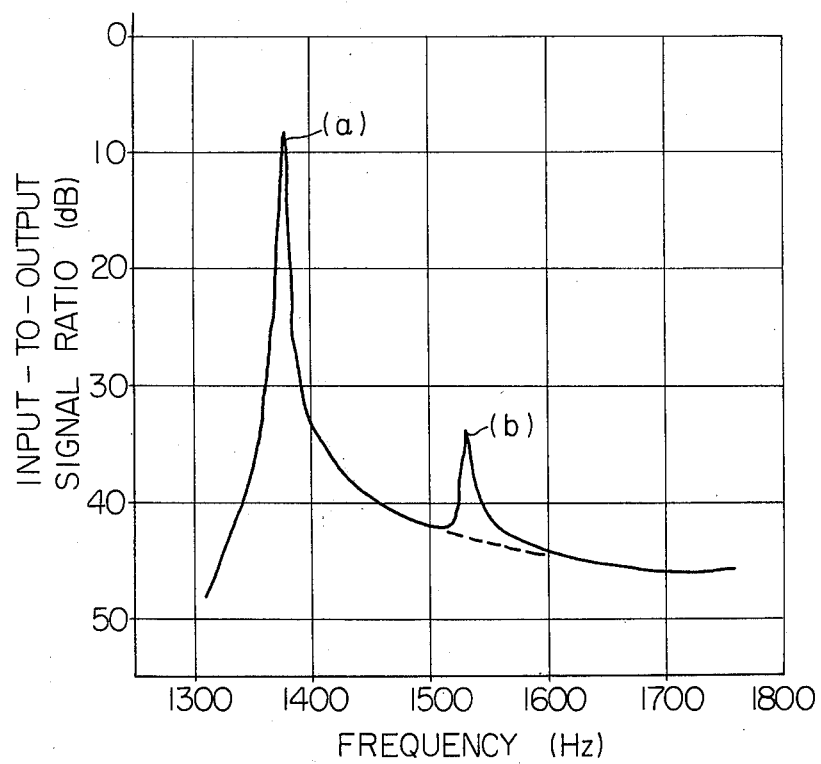
FIG. 3 is a graphic illustration showing frequency vs input-to-output signal ratio of the FIG. 1 arrangement.

There is also a likelihood of the connecting leads 9 and 10 vibrating at a natural frequency determined by the length and configuration thereof, and caused by the vibration of the reed elements 1 and 1'. Such vibration of the connecting leads will produce a spurious resonance which produces a peak (b) in the input-to-output signal characteristic curve as shown in FIG. 3 adjacent to the main resonance peak (a) caused by the reed elements. With the decrease in size of the reed filter, a possibility of the spurious vibration causing the malfunctioning of the output circuit would become great.

In accordance with the present invention, a mound of resilient adhesive such as silicon rubber is applied to the contact point of the connecting leads 9 and 10 as at 11 and 11' (see FIGS. 4 and 5). With this arrangement, the vibration of the connecting leads is absorbed by the resilient adhesive so that the spurious resonances referred to above are materially reduced and the contact failure at points 11 and 11' is also avoided since the impact force is distributed to the increased contact area between the adhesive and the piezoelectric element.

Figure 6:
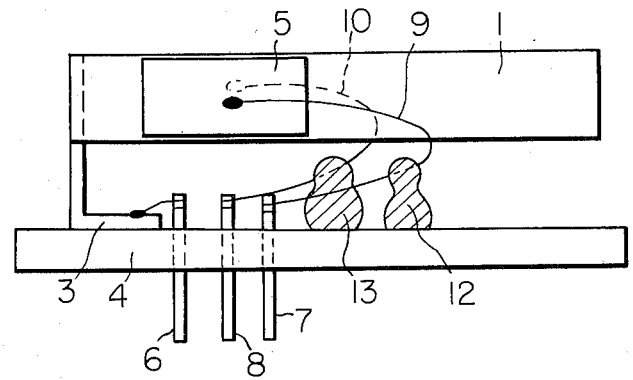
FIG. 6 is a view in elevation of the reed filter showing another embodiment of the invention.
Figure 7:
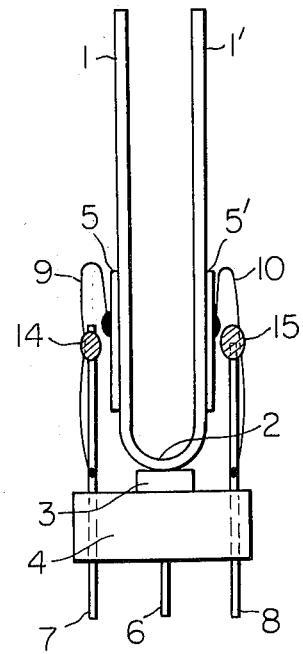
FIG. 7 is view in elevation of the reed filter showing a modified form of the FIG. 6 arrangement.

The resilient adhesive may be applied to any portion of the lead wires so far as it ensures against the spurious vibration and the deformation of the connecting wires. In FIG. 6 the reed elements 1 and 1' extend parallel to the plane of the base member 4 and the resilient adhesive such as silicon rubber is applied in the form of lumps 12 and 13 which resiliently hold the wires 9 and 10 at their midpoint to the base member 4. The resilient adhesive may also be applied to the upper ends of the terminals 7 and 8 to which the lead wires 12 and 13 are connected. In FIG. 7, the terminals 7 and 8 extend through the base member 4 in parallel with the longitudnal axis of the reed elements 1 and 1' to a point adjacent to the piezoelectric elements 5 and 5'. Lumps 14 and 15 of the resilient adhesive are applied to the upper ends of the terminals 7 and 8, respectively, so that the lead wires 9 and 10 are resiliently held in position at their middle points. Auxiliary supports may be provided in a position adjacent to the piezoelectric elements instead of extending the terminals 7 and 8 to resiliently hold the lead wires 9 and 10. With these arrangements, the reed elements 1 and 1' are less affected by the connecting leads 9 and 10 to vary their fundamental frequency and the spurious vibration caused by the connecting leads are effectively suppressed.

Fig. 8 illustrates another example wherein the connecting lead 9 is connected to the terminal 7 in such a manner that a part 9a of several turns of the end of the lead is soldered to the terminal end 7a and integral therewith, and the remaining part of the turns is loosely disposed around the axis of the terminal and spaced from the terminal so that the remaining part provides a spring action. The same arrangement is provided for the connecting lead 10 with respect to the terminal 8.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. In an electromechanical reed filter of the type comprising, a base member, a pair of elongated, mechanically resonant reed elements, one end region of each of said reed elements being connected together and to said base member, electromechanical transducers each being secured to the side surface of a respective one of said reed elements, a pair of terminals on said base member, and connecting leads connected at the opposite ends thereof to said terminals and to said electromechanical transducers, the improvement which comprises: means comprising a resilient material adhered to the connections of said connecting leads with said transducers for damping resonant vibrations of said connecting leads, thereby to prevent spurious resonances of said mechanically resonant reed elements.

2. In an electromechanical reed filter as claimed in claim 1, wherein said means for damping resonant vibrations comprises a resilient adhesive.

3. In an electromechanical reed filter as claimed in claim 2, further comprising an auxiliary support secured on said base member, and wherein at least one of said connecting leads is coupled to said support, and wherein said resilient adhesive is applied to the contact point of said auxiliary support and said connecting lead.

4. In an electromechanical reed filter as claimed in claim 1, wherein said means for damping resonant vibrations comprises means for absorbing mechanical shocks applied to said connecting leads, thereby to prevent reduction of the Q exhibited by said mechanically resonant reed elements.

5. In an electromechanical reed filter of the type comprising, a base member, a pair of elongated, mechanically resonant reed elements, one end region of each of said reed elements being connected together and to said base member, electromechanical transducers each being secured to the side surface of a respective one of said reed elements, a pair of terminals on said base member, and connecting leads connected at the opposite ends thereof to said terminals and to said electromechanical transducers, the improvement which comprises: said connecting leads each having an end portion comprised of a first part wound tightly about a respective one of said terminals and being integral therewith, and a remaining part which is wound spaced from the respective one of said terminals and coiled to impart resilience thereto, thereby to damp resonant vibrations of said connecting leads and prevent spurious resonances of said mechanically resonant reed elements.

6. In an electromechanical reed filter of the type comprising, a base member, a pair of elongated, mechanically resonant reed elements, one end region of each of said reed elements being connected together and to said base member, electromechanical transducers each being secured to the side surface of a respective one of said reed elements, a pair of terminals on said base member, and connecting leads connected at the opposite ends thereof to said terminals and to said electromechanical transducers, the improvement which comprises: means comprising a resilient material adhered to a portion of each of said connecting leads and a respective portion of each of said terminals for damping resonant vibrations of said connecting leads, thereby to prevent spurious resonances of said mechanically resonant reed elements.

7. In an electromechanical reed filter as claimed in claim 6, wherein said means for damping resonant vibrations comprises a resilient adhesive.

8. In an electromechanical reed filter as claimed in claim 7, wherein said resilient adhesive is applied to an intermediate portion of each of said connecting leads and to a respective end of each of said terminals.

9. An electromechanical reed filter as claimed in claim 7, wherein said resilient adhesive is applied to the connection of said connecting leads with said terminals.

10. In an electromechanical reed filter of the type comprising, a base member, a pair of elongated, mechanically resonant reed elements, one end region of each of said reed elements being connected together and to said base member, electromechanical transducers each being secured to the said surface of a respective one of said reed elements, a pair of terminals on said base member, and connecting leads connected at the opposite ends thereof to said terminals and to said electromechanical transducers, the improvement which comprises: means comprising a resilient material adhered to an intermediate portion of each of said connecting leads and to said base member for damping resonant vibrations of said connecting leads, thereby to prevent spurious resonances of said mechanically resonant reed elements.

11. In an electromechanical reed filter as claimed in claim 10, wherein said means for damping resonant vibrations comprises a resilient adhesive.

* * * * *